United States Patent [19]

Fusegawa et al.

[11] Patent Number: 5,359,959
[45] Date of Patent: * Nov. 1, 1994

[54] METHOD FOR PULLING UP SEMI-CONDUCTOR SINGLE CRYSTAL

[75] Inventors: Izumi Fusegawa; Hirotoshi Yamagishi, both of Annaka, Japan

[73] Assignee: Shin-Etsu Handotai Co., Ltd., Tokyo, Japan

[*] Notice: The portion of the term of this patent subsequent to Apr. 26, 2011 has been disclaimed.

[21] Appl. No.: 953,918

[22] Filed: Sep. 30, 1992

Related U.S. Application Data

[63] Continuation of Ser. No. 703,750, May 21, 1991, abandoned.

[30] Foreign Application Priority Data

May 25, 1990 [JP] Japan ................ 2-136365

[51] Int. Cl.$^5$ ............................ C30B 15/22
[52] U.S. Cl. ........................ 117/13; 117/917
[58] Field of Search ............ 156/601, 617.1, 618.1, 156/619.1, 620.4; 422/249

[56] References Cited

U.S. PATENT DOCUMENTS

| | | | |
|---|---|---|---|
| 3,607,139 | 9/1971 | Hanka et al. | 23/301 SP |
| 3,929,557 | 12/1975 | Goodrum | 156/617.1 |
| 4,619,730 | 10/1986 | Suzuki et al. | 156/617.1 |
| 4,622,211 | 11/1986 | Suzuki et al. | 156/617.1 |
| 4,637,854 | 1/1987 | Fukuda et al. | 156/607 |
| 4,659,423 | 4/1987 | Kim et al. | 156/617.1 |
| 4,830,703 | 5/1989 | Matsutani | 156/617.1 |
| 4,849,188 | 7/1989 | Takasu et al. | 422/249 |

FOREIGN PATENT DOCUMENTS

| | | |
|---|---|---|
| 0135676 | 4/1985 | European Pat. Off. . |
| 0285943 | 10/1988 | European Pat. Off. . |
| 3701733 | 8/1988 | Germany . |
| 0081086A | 10/1983 | Japan . |
| 2109267 | 6/1983 | United Kingdom . |
| 2191113A | 4/1987 | United Kingdom . |

OTHER PUBLICATIONS

IBM Technical Bulletin Vo. 26, No. 11, Apr. 1984, Control Of Oxygen In Czochralski Silicon Crystals Through Combining Magnetic Field And Crystal Rotation; K. M. Kim, et al.

Applied Physics Letter, vol. 50, No. 6 Feb. 9, 1987; Programmed Magnetic Field Applied Liquid Encapsulated Czochralski Crystal Growth; S. Ozawa, et al.

Research: "Getting Holes Out of Silicon Chips"; Sony Corp.

Primary Examiner—R. Bruce Breneman
Assistant Examiner—Felisa Garrett
Attorney, Agent, or Firm—Ronald R. Snider

[57] ABSTRACT

A semiconductor single crystal rod having a controlled oxygen concentration distribution in the direction of length is produced by method of pulling up a semiconductor melt held in a quartz glass crucible under application of a magnetic field, which method is characterized by fixing the speed of revolution of the quartz glass crucible and varying the intensity of the magnetic field applied to the melt according to the length of pull-up of the single crystal rod.

11 Claims, 4 Drawing Sheets

METHOD FOR PULLING UP SEMI-CONDUCTOR SINGLE CRYSTAL

This application is a continuation of application Ser. No. 07/703,750, filed May 21, 1991 now abandoned.

BACKGROUND OF THE INVENTION

1. Field of the Invention

This invention relates to a method for the growth of a semiconductor single crystal by causing a seed crystal to contact a molten semiconductor in quartz crucible and pulling up a rod of semiconductor single crystal. More particularly, this invention relates to a method for the growth of a semiconductor single crystal, characterized by imparting a prescribed distribution to the oxygen concentration of the semiconductor single crystal in the direction of length of pull-up thereof by the adjustment of the intensity of a magnetic field applied to the molten semiconductor.

2. Description of the Prior Art

In the growth of a single crystal of silicon by the Czochralski method, a quartz ($SiO_2$) crucible is used as a container for holding molten silicon. It is known that since silicon at the melting point thereof is chemically active, the molten silicon reacts with the quartz of the crucible and dissolves the quartz into itself and, as a result, the grown single crystal of silicon contains a fair amount of oxygen. At the same time that the quartz glass of the crucible dissolves into the molten silicon, the trace of impurities present in the shell of the crucible are dissolved and eventually incorporated in the grown single crystal of silicon.

The oxygen of the single crystal of silicon is welcomed on account of the so-called intrinsic gettering effect. Techniques for uniformly distributing oxygen on a relatively high level, a level on from 15 to 20 ppma, for example, throughout the entire length of the single crystal of silicon have been developed. Japanese Patent Publication SHO 60(1985)-6,911 and Japanese Patent Application Disclosure SHO 57(1982)-135,796, for example, disclose such techniques. In consequence of the advance of the technology for the manufacture of integrated circuits, the demand for the intrinsic gettering effect has dwindled and, at the same time, the demand for a single crystal of silicon containing impurities other than oxygen in the smallest possible concentration has grown. The trend has urged development of a method for producing a crystal of high purity by applying a magnetic field to molten silicon thereby curbing the melt of the raw material for the crystal from undergoing convection and consequently repressing the dissolution of the quartz glass of the crucible. One technique for embodying the method is disclosed in Japanese Patent Application Disclosure SHO 56(1981)-104,791, for example.

Japanese Patent Publication SHO 60(1985)-6,911 discloses a method which, in the process for pulling up a rod of a single crystal from the melt of the raw material for semiconductor held in a quartz glass crucible in accordance with the Czochralski method, controls the gradient of the speed of revolution of the crucible so as to be reciprocal to the gradient of the oxygen concentration profile measured along the direction of pull-up.

Japanese Patent Application Disclosure SHO 57(1982)-135,796 discloses a method which comprises pulling up a grown seed crystal of silicon while rotating it in the direction opposite that of the rotation of the crucible for the melt at a large initial speed of revolution and further increasing the speed of revolution in proportion as the amount of the melt in the crucible decreases.

Japanese Patent Application Disclosure SHO 56(1981)-104,791 discloses a method for producing a crystal of high purity by applying a magnetic field to the raw material for the crystal thereby curbing the melt from undergoing convection and consequently repressing the dissolution of the quartz glass of the crucible.

None of the techniques described above, however, contemplates repressing the oxygen concentration in the grown single crystal to a low level even below 10 ppma, for example, throughout the entire volume of the rod of single crystal, uniformizing the distribution of oxygen concentration from the head to the tail of the rod of crystal, or controlling the distribution arbitrarily.

SUMMARY OF THE INVENTION

This invention, initiated in the light of the true state of prior art described above, aims to provide a method for accurate control of oxygen concentration of a single crystal rod of silicon with accuracy within ±5 to 10% where the grown single crystal has a low oxygen concentration substantially not more than 10 ppma throughout the entire length thereof, an oxygen concentration distribution controlled as prescribed in the direction of length, and this oxygen concentration distribution uniformized.

DETAILED DESCRIPTION OF THE INVENTION

This invention is directed to a method for pulling up a semiconductor single crystal rod from a semiconductor melt held in a quartz glass crucible under application of a magnetic field, which method is characterized by fixing the speed of revolution of the quartz glass crucible and varying the intensity of the magnetic field applied to the melt according to the length of pull-up of the single crystal rod.

Now, this invention will be described in detail below with reference to the accompanying drawings.

Figure 1:
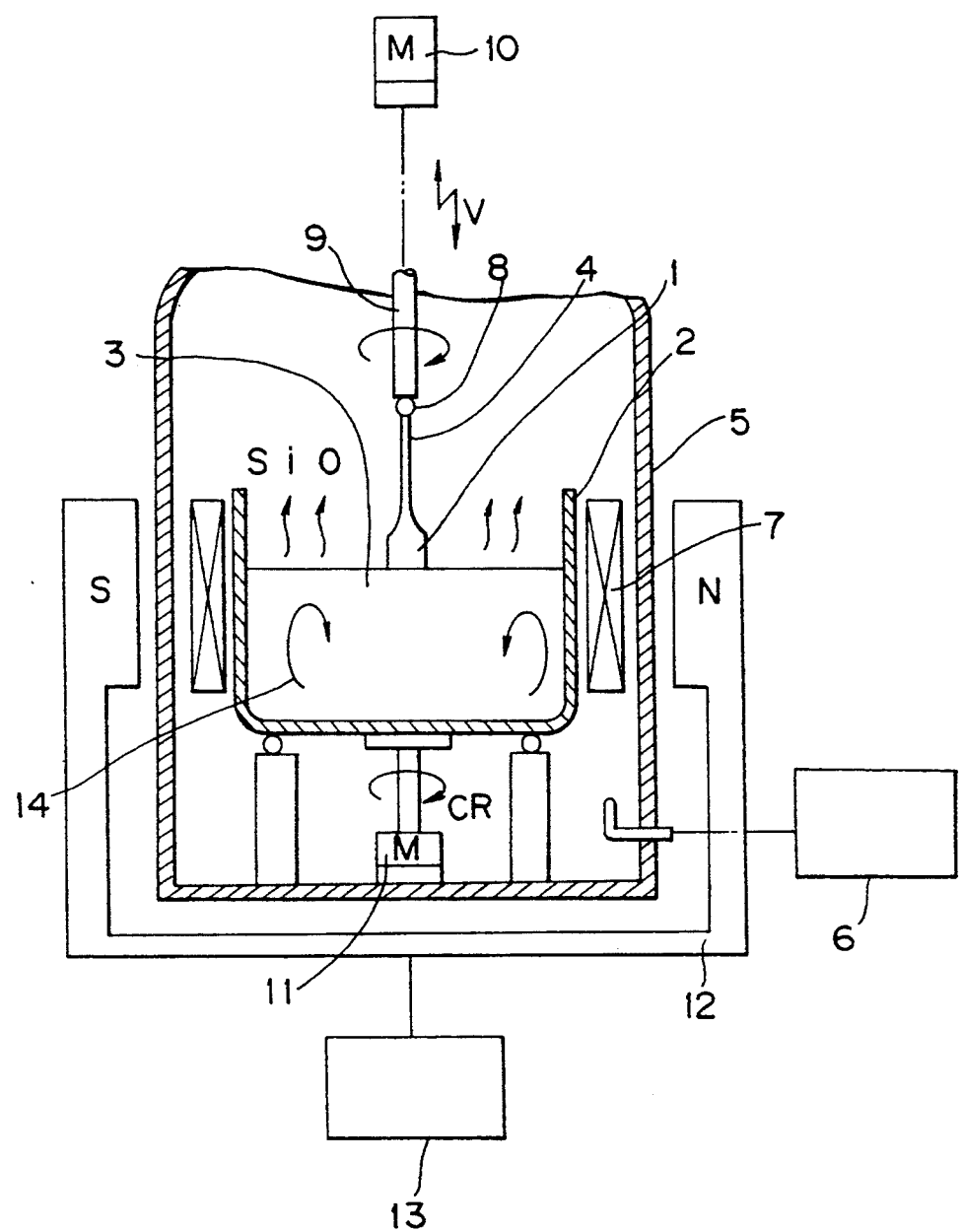
FIG. 1 is a partial axial cross section illustrating an outlined construction of a device used for working the method of this invention.

FIG. 1 illustrates an outline construction of a device to be used for the growth of a semiconductor single crystal rod 1 of this invention.

Argon gas from an argon gas supply source 6 is supplied at a prescribed flow rate into a hermetically closed furnace 5. The argon gas is released through an unshown discharge outlet as accompanied by the gaseous SiO generated within the hermetically closed furnace 5. A quartz crucible 2 possessing a shape open at the top is disposed substantially at the center of the hermetically closed furnace 5. Silicon thermally melted by heating means 7 disposed around the quartz crucible 2 is held as a melt 3 in the quartz crucible 2. A seed crystal 4 of silicon is disposed as posed in contact with the surface of the melt 3 of silicon. The seed crystal 4 is connected to a rotary shaft 9 rotated by a motor 10 through the medium of a pull-up chuck 8. The rotary shaft 9 is rotated by the motor 10 and, at the same time, pulled up at a fixed low speed v by unshown lifting means. The quartz crucible 2 is rotatably supported on the bottom surface of the hermetically closed furnace 2 and rotated at a fixed low speed (represented as "CR") by a motor 11. This speed is desirably selected in the range of 0 to 3 rpm.

Magnetic field generating means 12 formed as of an electromagnet and adapted to vary the intensity of a magnetic field as with a direct current I is disposed outside the hermetically closed furnace 5. An electric current source for supplying the electric current I to the magnetic field generating means 12 is denoted with the reference numeral 13.

Figure 2:
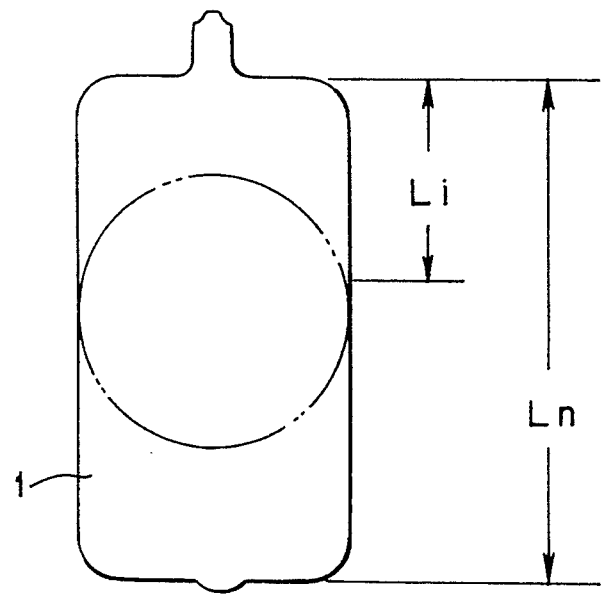
FIG. 2 is a front view illustrating a single crystal rod of silicon formed by the device of FIG. 1.

The single crystal rod 1 of silicon illustrated in FIG. 2 is formed by keeping the quartz crucible 2 and the seed crystal 4 rotated at a fixed low speed and pulling up the seed crystal 4 held in contact with the surface of the melt 3 at a low speed v in the direction of pull-up. Since the quartz crucible 2 and the melt 3 are in contact with each other along the inner wall of the quartz crucible as illustrated in FIG. 1, friction occurs in the part of their contact to rub the quartz crucible 2 and dissolve oxygen out of the quartz crucible 2 into the melt 3.

The oxygen which has been dissolved into the melt 3 is combined with Si to form volatile SiO, which is released from the melt 3 and removed as entrained by the argon gas. Since the part of oxygen which has escaped being released and removed in the form of SiO persists in the melt 3, the single crystal rod 1 of silicon is not perfectly purified but is suffered to contain oxygen. Since the oxygen which is contained in the single crystal rod 1 of silicon consists mainly of interstitial oxygen, the oxygen concentration in the single crystal of silicon can be substantially found by determination of the interstitial oxygen concentration (Oi). Since the amount of the oxygen which mingles into the melt 3 is proportional to the degree with which the melt rubs the inner wall of the quartz crucible 2, this amount is decreased by decreasing the amount of the silicon melt.

Figure 3:
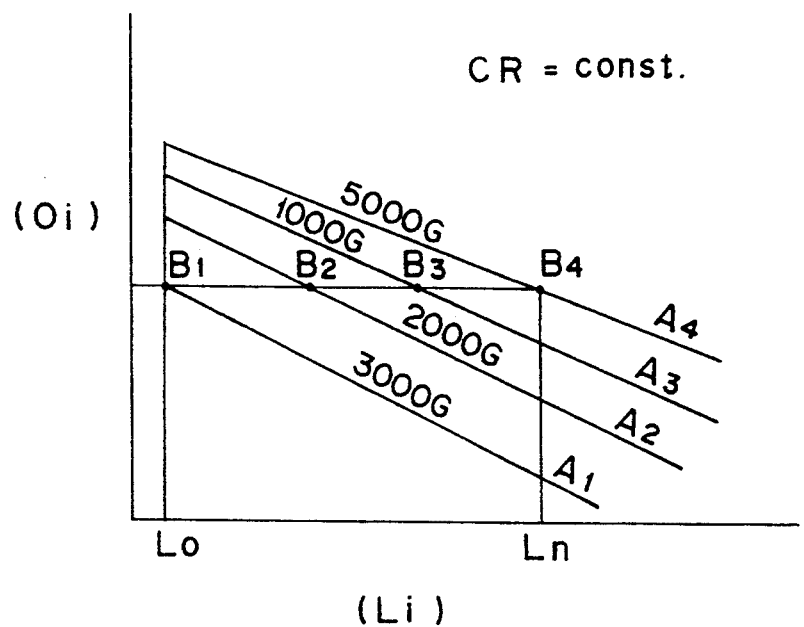
FIG. 3 is a graph showing the relation between the length of pull-up of the single crystal rod of silicon and the oxygen concentration, with the intensity of magnetic field as a parameter.

When the single crystal rod 1 of silicon is pulled up under a fixed condition as illustrated in FIG. 2, therefore, there exists conceptually a relation as shown in FIG. 3 between the length, Li, of the single crystal rod 1 of silicon measured in the direction of pull-up and the interstitial oxygen concentration, Oi. To be specific, by showing Li on the horizontal axis and Oi on the vertical axis, Oi decreases substantially linearly in accordance as Li increases as indicated by rectilinear lines $A_1$ to $A_4$.

The magnetic field generating means 12 is disposed around the quartz crucible 2 so as to exert magnetic force upon the melt 3. When the speed of revolution, CR, of the quartz crucible 2 is small, an increase in the intensity of the magnetic field represses the convection 14 which occurs in melt 3 and decreases as the dissolution of oxygen from the quartz crucible 2 side. When the speed of revolution, CR, exceeds a certain level, an increase in the intensity of the magnetic field, though serving to repress the convection, enhances the apparent viscosity due to the applied magnetic field and consequently augments the friction between the inner wall of the quartz crucible 2 and the melt 3 and conversely increases the amount of dissolved oxygen. The threshold value of the speed of revolution of the quartz crucible falls in the range of from 0 to 3 rpm. This threshold value decreases as the diameter of the quartz crucible increases and it also varies with the condition of the magnetic field.

FIG. 3 illustrates a case in which the speed of revolution, CR, is below the threshold value mentioned above. In the diagram, $A_1$ represents the case in which the intensity of magnetic field is 3,000 gausses (G), $A_2$ the case of 2,000 gausses (G), $A_3$ the case of 1,000 gausses (G), and $A_4$ the case of 500 gausses (G). The lines, $A_4$ to $A_1$, occupy successively lower positions in the order mentioned. To be specific, when the intensity of magnetic field grows, the rectilinear relation between Li and Oi is moved in the direction in which the oxygen concentration, Oi, decreases, though the gradient is retained unchanged.

The retention of the oxygen concentration, Oi, at a fixed value is realized as illustrated in FIG. 3, for example, by varying the magnitude of the intensity, Gi, of magnetic field in inverse proportion to the variation of Li. To be specific, the oxygen concentration, Oi, can be retained at a fixed value, Oio, by using the intensity of magnetic field, 3,000 gausses, at the intersection $B_1$ when Li is Lo and changing the intensity of magnetic field to 2,000 gausses, 1,000 gausses, and 500 gausses at the respective intersections $B_2$ to $B_4$ according as Li advances.

In this invention, a horizontal magnetic field is used as the magnetic field generating means 12 and the intensity of magnetic field is changed in the range of 500 gausses (G) to 5,000 gausses (G). The horizontal magnetic field is employed it allows direct repression of the convection 14 and permits itself to be adjusted surely and quickly.

The convection of the melt cannot be effectively repressed when the intensity is less than 500 gausses. If this intensity exceeds 5,000 gausses, since the melt assumes very high apparent viscosity and remains in a substantially resting state and obstructs its own agitation by convection, the produced crystal suffers from poor quality particularly because of extreme concavity in the surface of growth of crystal relative to the melt, for example.

Figure 4:
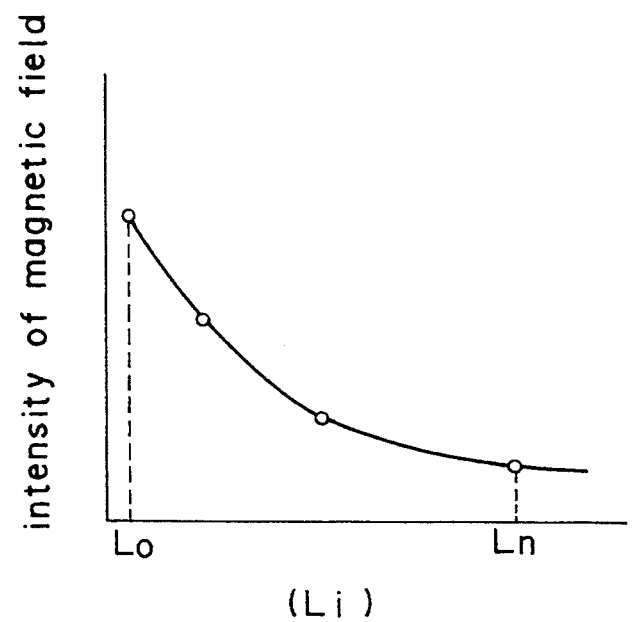
FIG. 4 is a graph showing the relation between the single crystal rod and the intensity of magnetic field as obtained from the graph of FIG. 3.

The graph of FIG. 4 is obtained by drawing a line of Oio based on the data obtained from FIG. 3 and plotting changes in the intensity of magnetic field intersecting the drawn line relative to the length of pull-up of the single crystal rod. When the single crystal rod is pulled up in accordance with the pattern of FIG. 4, the produced single crystal rod is allowed to acquire a fixed oxygen concentration from the head to the tail thereof.

The operation described thus far has been aimed at uniformizing the oxygen concentration. Even when this operation is generalized so that the magnitude of Oi becomes a function of Li as represented by the expression, Oi=f(Li), a single crystal having a desired oxygen concentration distribution can be obtained by drawing a line of Oi=f(Li) on FIG. 3 in the same manner as described above thereby finding points of intersection, plotting the values of intensity of magnetic field at these points of intersection relative to the lengths of pull-up of the single crystal rod while varying the intensity of magnetic field in inverse proportion to the length of pull-up in accordance with the pattern of the graph.

[Example]

Now, this invention will be described more specifically below with reference to a working example.

Example 1

The production of a single crystal of silicon in accordance with the Czochralski method (CZ pull-up method) 60 kg of polysilicon was placed in a quartz crucible 18 inches in diameter, melted therein. From the resultant melt of polysilicon, a single crystal of silicon 6 inches in diameter was pulled up in an orientation of (100). In this case, the so-called horizontal magnetic field MCZ method (HMCZ) was used to apply a magnetic field in one direction perpendicular to the direction of growth. The test results are shown below.

Figure 5:
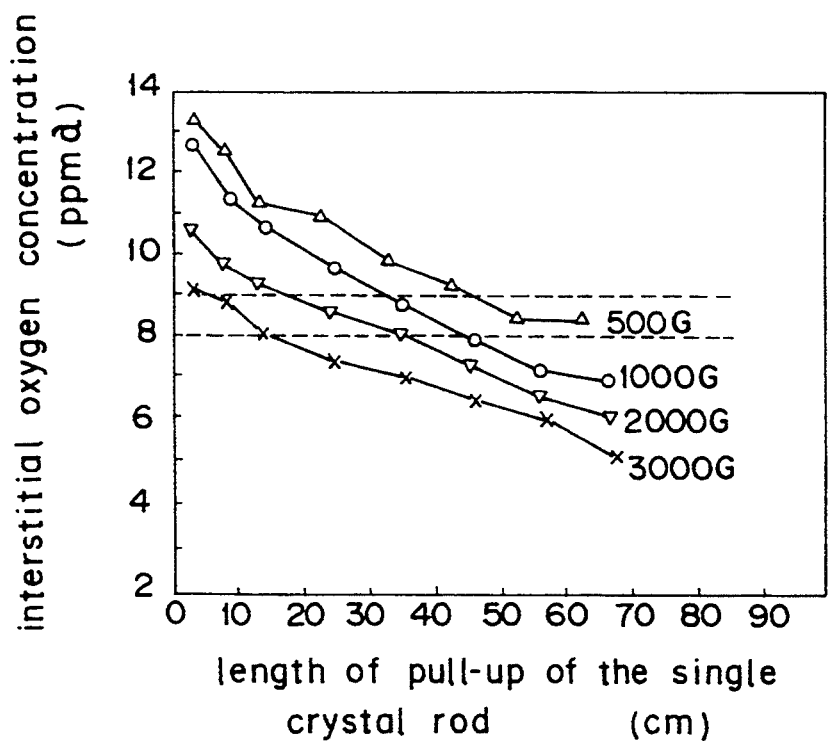
FIG. 5 is a graph showing the relation between the length of pull-up of the single crystal rod of silicon and the interstitial oxygen concentration as obtained in a working example, with the intensity of magnetic field as a parameter.

FIG. 5 shows the relation between the intensity of magnetic field and the interstitial oxygen concentration in the crystal obtained in an operation using the crucible at a speed of 0.5 rpm and the seed crystal at a speed of 20 rpm. The intensity of magnetic field was varied between 500 to 3,000 gausses. It is clearly noted from this graph that the oxygen concentration decreased in accordance as the length of pull-up (ratio of solidification) increased and the oxygen concentration also decreased in inverse proportion to the increase intensity of magnetic field. As a measure to produce a single crystal of silicon having an oxygen concentration controlled at a fixed level in the range of 8 to 9 ppma, the method which resorts to gradual increase of the speed of revolution of the crucible has been known to date. As inferred from FIG. 5, the same effect can be brought about by varying the intensity of magnetic field in inverse proportion to the length of pull-up (ratio of solidification) while keeping the speed of revolution of the crucible at 0.5 rpm.

Figure 6:
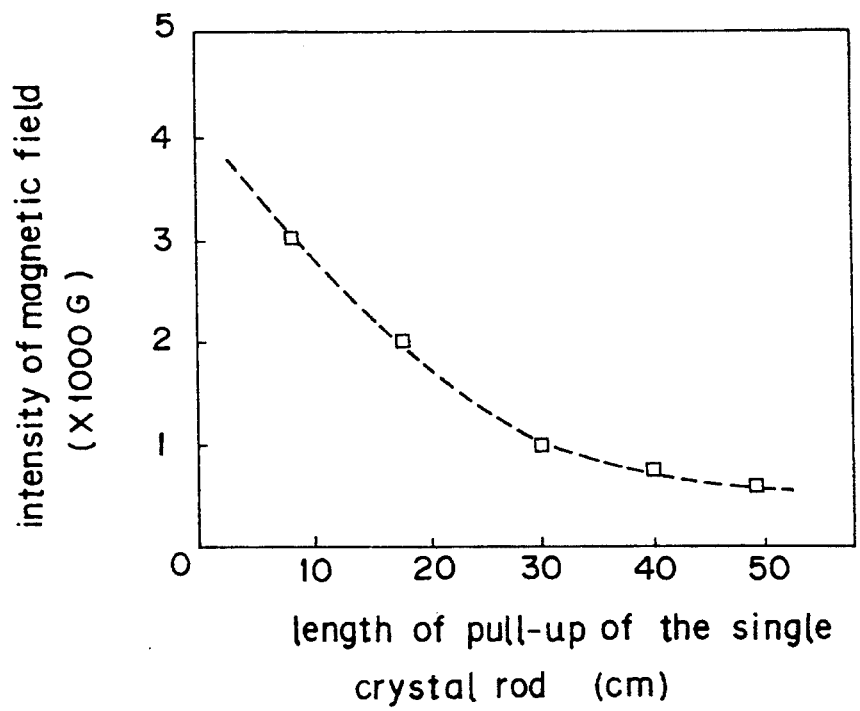
FIG. 6 is a graph showing the relation between the intensity of magnetic field required for the oxygen concentration obtained on FIG. 5 to fall in the range of 8 to 9 ppma and the length of pull-up of the single crystal rod.
Figure 7:
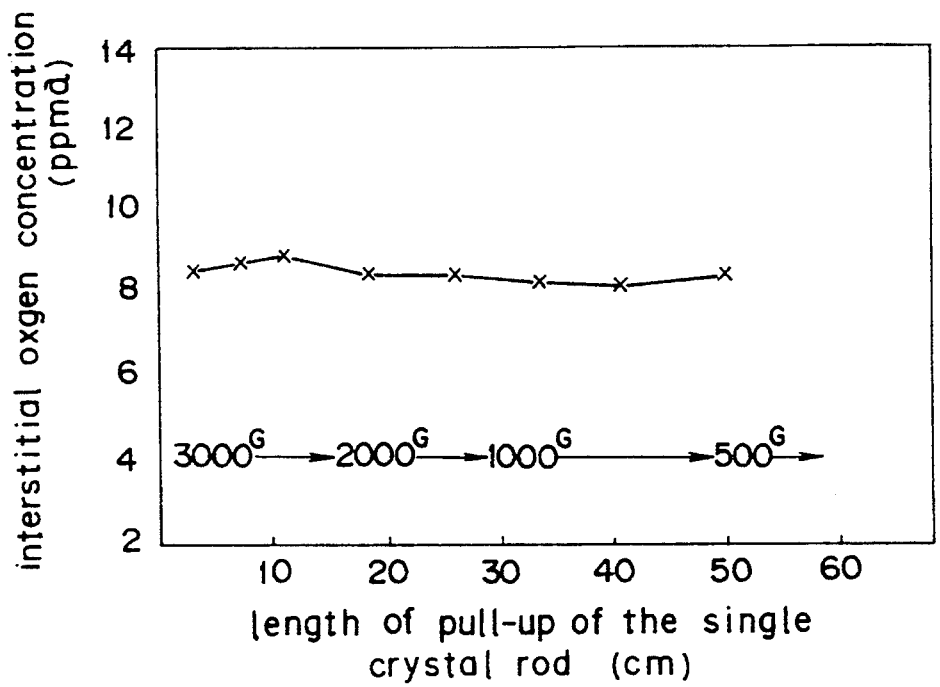
FIG. 7 is a graph showing the relation between the length of pull-up of the single crystal rod pulled up with the intensity of magnetic field varied according to the length of pull-up in accordance with FIG. 6 and the interstitial oxygen concentration.

From FIG. 5, pattern for varying the intensity of magnetic field in inverse proportion to the length of pull-up to fix the oxygen concentration in the range of 8 to 9 ppma was obtained. This pattern is shown in FIG. 6. In the actual pull-up operation, the intensity of magnetic field was varied in proportion to the length of pull-up of the single crystal of silicon in accordance with the pattern of FIG. 6 memorized in a computer. The results of this operation are shown in FIG. 7. Single crystal rods of silicon produced by this pull-up operation were found to possess oxygen concentrations generally falling in the range of 8 to 9 ppma.

While the present invention has been described by means of a specific embodiment, it is to be understood that numerous changes and modifications may be made therein without departing from the spirit and scope of the invention as defined in the appended claims.

As is plain from the description given above, this invention brings about the following effects.

(1) A single crystal rod can be pulled up with the distribution of interstitial oxygen concentration freely controlled. For example, single crystal rods possessing a varying oxygen concentration distribution are obtained, such as those having a uniform oxygen concentration throughout the entire length of single crystal rod and those having a gradual concentration gradient as compared with the conventional product.

(2) A single crystal rod having a generally low oxygen concentration is obtained.

What is claimed is:

1. A method of pulling a single crystal rod from a semiconductor melt retained in a quartz glass crucible under application of a magnetic field comprising:
   i) maintaining the rotational speed at a constant level selected between 0 to 3 rpm;
   ii) applying the magnetic field in a horizontal direction;
   iii) maintaining the strength of the magnetic field within a range between 500 to 5000 gauss; and
   iv) varying the strength of the magnetic field in correspondence with the length of pull-up of said crystal rod, the variation being on the basis of experimental results concerning change of the interstitial oxygen concentration along the axial direction of the crystal rod obtained in a plurality of growth conditions where at least the magnetic field strength and the rotational speed of the quartz glass crucible are kept constant through each whole process.

2. A method according to claim 1, wherein the speed of revolution of said quartz glass crucible is in the range of 0 to 3 rpm.

3. A method according to claim 1, wherein said magnetic field is a horizontal magnetic field.

4. A method according to claim 1, wherein the intensity of said horizontal magnetic field is in the range of 500 to 5,000 gausses.

5. A method according to claim 1, wherein the rate of change of magnetic field intensity with regard to time is adjusted in inverse proportion to iterstitial oxygen concentration gradient in the direction of the pull-up length of said single crystal rod being pulled up.

6. A method according to claim 1, wherein the intensity of the magnetic field is varied in inverse proportion to the length of the pull-up of the crystal.

7. A method according to claim 1, wherein the intensity of the magnetic field is decreased as the length of the pull-up of said single crystal rod increases.

8. A method according to claim 1, wherein the speed of revolution of the crucible does not exceed a level where an increase in the intensity of the magnetic field augments friction between the inner wall of the quartz crucible and the melt, thereby increasing the amount of dissolved oxygen.

9. A method according to claim 1, further comprising controlling the intensity of the magnetic field to adjust the oxygen distribution along the length of the crystal rod.

10. A method according to claim 1, further comprising controlling interstitial oxygen concentration is controlled by varying the magnetic field over the length of the crystal.

11. The method in accordance with claim 1, wherein the intensity of the magnetic field is varied along the length of the crystal so as to maintain the oxygen concentration along the crystal length substantially constant.

* * * * *